(12) United States Patent
Balasubramanian et al.

(10) Patent No.: US 11,762,413 B2
(45) Date of Patent: Sep. 19, 2023

(54) CLOCK DUTY CYCLE CORRECTION

(71) Applicant: Apple Inc., Cupertino, CA (US)

(72) Inventors: Suresh Balasubramanian, Cupertino, CA (US); Sunil Bhosekar, Austin, TX (US); Bruce Andrew Doyle, Longmont, CO (US); Chad O. Lackey, Austin, TX (US); Sharath R. Srinivasan, Austin, TX (US); Erick O. Torres, Austin, TX (US); Khaled M. Alashmouny, Orange, CA (US)

(73) Assignee: Apple Inc., Cupertino, CA (US)

( * ) Notice: Subject to any disclaimer, the term of this patent is extended or adjusted under 35 U.S.C. 154(b) by 98 days.

(21) Appl. No.: 17/476,307

(22) Filed: Sep. 15, 2021

(65) Prior Publication Data

US 2022/0103166 A1    Mar. 31, 2022

Related U.S. Application Data

(60) Provisional application No. 63/083,744, filed on Sep. 25, 2020.

(51) Int. Cl.
*G06F 1/10* (2006.01)
*G06F 1/08* (2006.01)

(52) U.S. Cl.
CPC . *G06F 1/10* (2013.01); *G06F 1/08* (2013.01)

(58) Field of Classification Search
CPC .................................... G06F 1/08; G06F 1/10
See application file for complete search history.

(56) References Cited

U.S. PATENT DOCUMENTS

| | | | |
|---|---|---|---|
| 6,326,812 B1 | 12/2001 | Jefferson | |
| 7,961,559 B2 | 6/2011 | Dixon et al. | |
| 10,498,475 B1 | 12/2019 | Devineni et al. | |
| 2013/0191677 A1* | 7/2013 | Ziesler | G06F 1/3237 327/175 |
| 2020/0106430 A1 | 4/2020 | Martin et al. | |

* cited by examiner

*Primary Examiner* — Stefan Stoynov
(74) *Attorney, Agent, or Firm* — Fletcher Yoder P.C.

(57) ABSTRACT

Systems, methods, and devices are provided for calibrating and correcting a clock duty cycle. An integrated circuit may include a clock tree that provides a clock signal and a circuit that is sensitive to clock duty cycle that receives the clock signal at a lower level of the clock tree. A first duty cycle correction circuit may adjust a clock duty cycle of the clock signal to a first target duty cycle at a higher level of the clock tree. A second duty cycle correction circuit may adjust a clock duty cycle of the clock signal to a second target duty cycle at the lower level of the clock tree.

20 Claims, 13 Drawing Sheets

CLOCK DUTY CYCLE CORRECTION

CROSS-REFERENCE TO RELATED APPLICATIONS

This application claims priority to and the benefit of U.S. Provisional Application No. 63/083,744, filed Sep. 25, 2020, and entitled, "CLOCK DUTY CYCLE CORRECTION," which is incorporated herein by reference in its entirety for all purposes.

BACKGROUND

This disclosure relates to calibrating and correcting a clock duty cycle in an integrated circuit.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Electronic devices that contain integrated circuits are ubiquitous, encompassing computers, handheld devices, wearable devices, automobiles, and more. Digital integrated circuits operate by performing operations based on a clock signal. A clock signal is a digital signal that alternates between a high state (e.g., logical 1) and a low state (e.g., logical 0) at a particular clock frequency. The clock signal may be generated by a clock source, such as a phased locked loop (PLL), and subsequently distributed across the integrated circuit in a structure known as a clock tree. Various circuits of the integrated circuit may perform operations and transfer data according to the changes in state of the clock signal.

Some circuits may use both rising edges and falling edges of the clock signal. These circuits may be particularly sensitive to the duty cycle of the clock signal, which is the ratio of each clock cycle that the clock signal is in a high state compared to a low state. For example, a clock signal that is equally high and low would have a 50% duty cycle. Circuits may be designed to operate using a particular duty cycle. For example, circuits that transfer data twice per clock cycle at a double data rate (DDR) transfer rate may operate using a 50% duty cycle. If the duty cycle differs too much from 50%, some circuits could malfunction. Circuits that are sensitive to duty cycle may be designed to have greater tolerance for duty cycle variation, but this may sacrifice possible performance.

SUMMARY

A summary of certain embodiments disclosed herein is set forth below. It should be understood that these aspects are presented to provide the reader with a brief summary of these certain embodiments and that these aspects are not intended to limit the scope of this disclosure.

A desired clock duty cycle may be obtained calibrating using a feedback signal and correcting the clock duty cycle at runtime based on the calibration. For example, during a calibration phase, the duty cycle of a clock signal may be calibrated in multiple locations along the clock tree. A global clock calibration circuit may use feedback to determine global calibration codes that, when applied to a duty cycle correction circuit of a main clock source of the integrated circuit, result in a target duty cycle at a global clock signal node. The global calibration codes may be stored for later access during runtime. Having calibrated the global clock signal, one or more local clock signals deriving from the global clock signal may be calibrated. A local clock calibration circuit may use feedback to determine local calibration codes that, when applied to a duty cycle correction circuit of a lower-level clock node of the clock tree, result in a target duty cycle at a local clock signal node. The local calibration codes may also be stored. Thereafter, at runtime, the duty cycle correction circuits may apply the stored codes, causing the resulting clock signals to have the target duty cycle. This may enable more precise, higher-performance circuits that may have a lower tolerance for duty cycle variation.

The calibration may take place once or at several different times. For example, calibration may be performed at manufacture, on device boot or wake, periodically (e.g., while charging at night, weekly, monthly, or annually), or upon switching dynamic voltage and frequency management (DVFM) states. The calibration, whether performed once or many different times, may be performed in one DVFM state or in several. For example, the clock duty cycle may be calibrated while clock is operating in a first DVFM state (e.g., a higher-frequency, higher-power state) and the resulting calibration codes may be stored. The clock duty cycle may also be calibrated while clock is operating in a second DVFM state (e.g., a lower-frequency, lower-power state) and the resulting calibration codes may also be stored. Thereafter, at runtime, which calibration codes are used to correct the clock duty cycle may be selected based on the current DVFM state. For example, a relatively higher DVFM state involve using calibration codes obtained for the first DVFM state, while a relatively lower DVFM state may involve using calibration codes obtained for the second DVFM state. As a consequence, the clock signal duty cycle may maintain a relatively low duty cycle error. Circuits that are sensitive to duty cycle may therefore operate properly even while the integrated circuit operates in a range of DVFM states.

BRIEF DESCRIPTION OF THE DRAWINGS

Various aspects of this disclosure may be better understood upon reading the following detailed description and upon reference to the drawings described below.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "including" and "having" are intended to be inclusive and mean that there may be additional elements other than the listed elements. Additionally, it should be understood that references to "some embodiments," "embodiments," "one embodiment," or "an embodiment" of the present disclosure are not intended to be interpreted as excluding the existence of additional embodiments that also incorporate the recited features. Furthermore, the phrase A "based on" B is intended to mean that A is at least partially based on B. Moreover, the term "or" is intended to be inclusive (e.g., logical OR) and not exclusive (e.g., logical XOR). In other words, the phrase A "or" B is intended to mean A, B, or both A and B.

Figure 1:
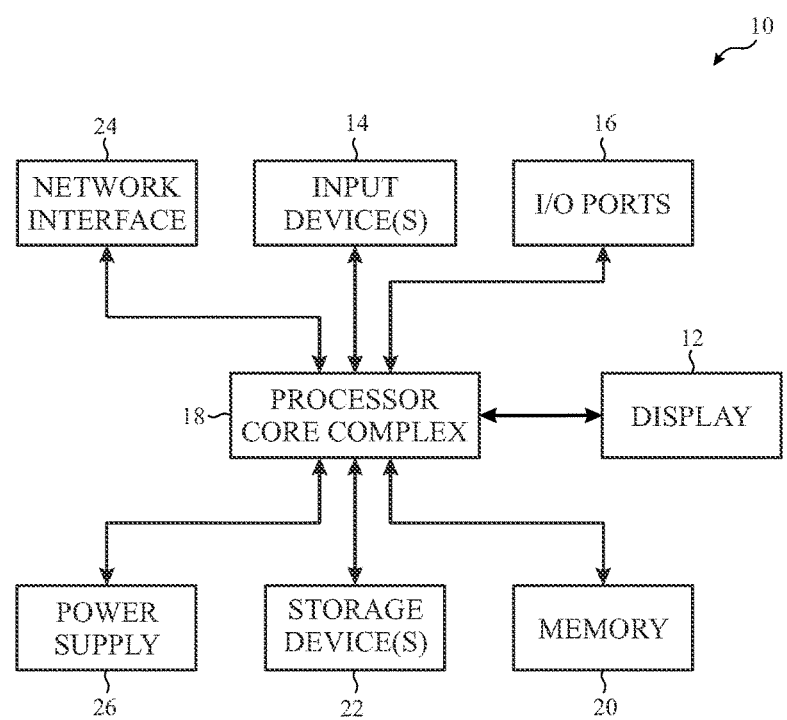
FIG. 1 is a schematic block diagram of an electronic device, in accordance with an embodiment.

This disclosure relates to calibrating and correcting a clock duty cycle in a clock tree of an integrated circuit. Maintaining a precise clock duty cycle may enable more precise, higher-performance circuits with lower tolerances. An example of an electronic device 10 that may benefit from these techniques is shown in FIG. 1. The electronic device 10 may be any suitable electronic device, such as a computer, a mobile (e.g., portable) phone, a portable media device, a tablet device, a television, a handheld game platform, a personal data organizer, a virtual-reality headset, a mixed-reality headset, a vehicle dashboard, and/or the like. Thus, it should be noted that FIG. 1 is merely one example of a particular implementation and is intended to illustrate the types of components that may be present in an electronic device 10.

The electronic device 10 may include an electronic display 12, input devices 14, input/output (I/O) ports 16, a processor core complex 18 having one or more processors or processor cores and/or image processing circuitry, memory 20 and/or storage devices 22, a network interface 24, and a power supply 26. The various components described in FIG. 1 may include hardware elements (e.g., circuitry), software elements (e.g., a tangible, non-transitory computer-readable medium storing instructions), or a combination of both hardware and software elements. It should be noted that the various depicted components may be combined into fewer components or separated into additional components. For example, the memory 20 and the storage devices 22 may be included in a single component. Additionally or alternatively, image processing circuitry of the processor core complex 18 may be disposed as a separate module or may be disposed within a camera module or the electronic display 12.

The processor core complex 18 may be operably coupled with the memory 20 and the storage device 22. As such, the processor core complex 18 may execute instructions stored in memory 20 and/or a storage device 22 to perform operations, such as generating, processing, and transferring data. The processor core complex 18 may include one or more microprocessors, one or more application specific processors (ASICs), one or more field programmable logic arrays (FPGAs), or any combination thereof.

In addition to instructions, the memory 20 and/or the storage device 22 may store data. Thus, the memory 20 and/or the storage device 22 may include one or more tangible, non-transitory, computer-readable media that store instructions executable by processing circuitry, such as the processor core complex 18, and/or data to be processed by the processing circuitry. For example, the memory 20 may include random access memory (RAM) and the storage device 22 may include read only memory (ROM), rewritable nonvolatile memory, such as flash memory, hard drives, optical discs, and/or the like.

The network interface 24 may enable the electronic device 10 to communicate with a communication network and/or another electronic device 10. For example, the network interface 24 may connect the electronic device 10 to a personal area network (PAN), such as a Bluetooth network, a local area network (LAN), such as an 802.11x Wi-Fi network, and/or a wide area network (WAN), such as a 4G, LTE, or 5G cellular network. In other words, the network interface 24 may enable the electronic device 10 to transmit data to a communication network and/or receive data from the communication network.

The power supply 26 may provide electrical power to operate the processor core complex 18 and/or other components in the electronic device 10, for example, via one or more power supply rails. Thus, the power supply 26 may include any suitable source of electrical power, such as a rechargeable lithium polymer (Li-poly) battery and/or an alternating current (AC) power converter. A power management integrated circuit (PMIC) may control the provision and generation of electrical power to the various components of the electronic device 10.

The I/O ports 16 may enable the electronic device 10 to interface with another electronic device 10. For example, a portable storage device may be connected to an I/O port 16, thereby enabling the electronic device 10 to communicate data, such as image data, with the portable storage device.

The input devices 14 may enable a user to interact with the electronic device 10. For example, the input devices 14 may include one or more buttons, one or more keyboards, one or more mice, one or more trackpads, and/or the like. Additionally, the input devices 14 may include touch sensing components implemented in the electronic display 12. The touch sensing components may receive user inputs by detecting occurrence and/or position of an object contacting the display surface of the electronic display 12. The electronic display 12 may also display images (e.g., image frames or pictures). For example, the electronic display 12 may display a graphical user interface (GUI) of an operating system, an application interface, text, a still image, or video content.

Figure 2:
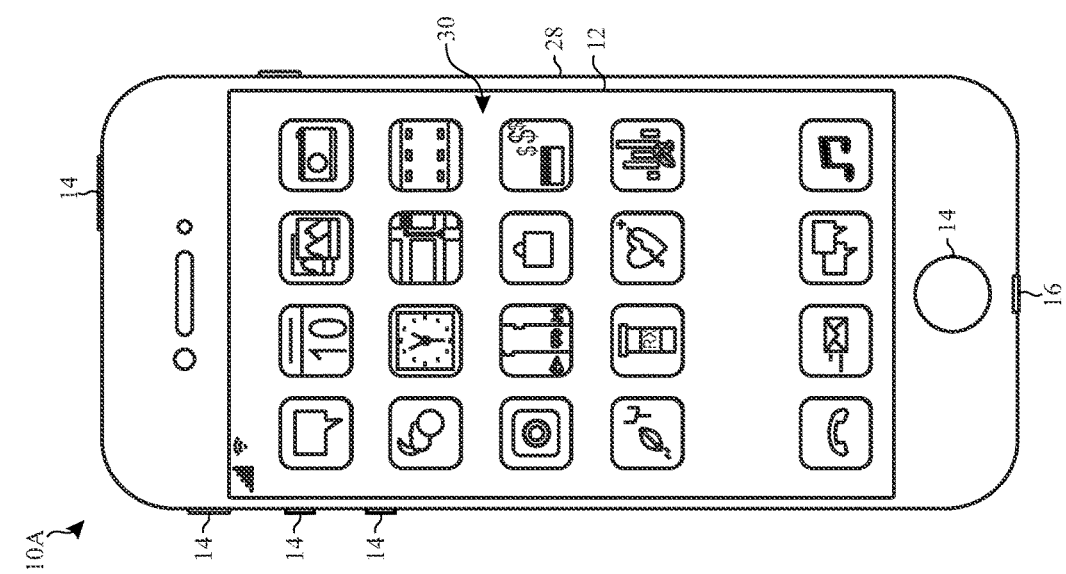
FIG. 2 is a front view of a mobile phone representing an example of the electronic device of FIG. 1, in accordance with an embodiment.

One example of the electronic device 10, specifically a handheld device 10A, is shown in FIG. 2. The handheld device 10A may be a portable phone, a media player, a personal data organizer, a handheld game platform, and/or the like. For example, the handheld device 10A may be a smart phone, such as any iPhone® model available from Apple Inc.

The handheld device 10A includes an enclosure 28 (e.g., housing). The enclosure 28 may protect interior components from physical damage and/or shield them from electromagnetic interference. In the depicted embodiment, the electronic display 12 is displaying a graphical user interface (GUI) 30 having an array of icons. By way of example, when an icon is selected either by an input device 14 or a touch sensing component of the electronic display 12, an application program may launch.

Input devices 14 may be provided through the enclosure 28. As described above, the input devices 14 may enable a user to interact with the handheld device 10A. For example, the input devices 14 may enable the user to activate or deactivate the handheld device 10A, navigate a user interface to a home screen, navigate a user interface to a user-configurable application screen, activate a voice-recognition feature, provide volume control, and/or toggle between vibrate and ring modes. The I/O ports 16 also open through the enclosure 28. The I/O ports 16 may include, for example, a Lightning® or Universal Serial Bus (USB) port.

Figure 3:
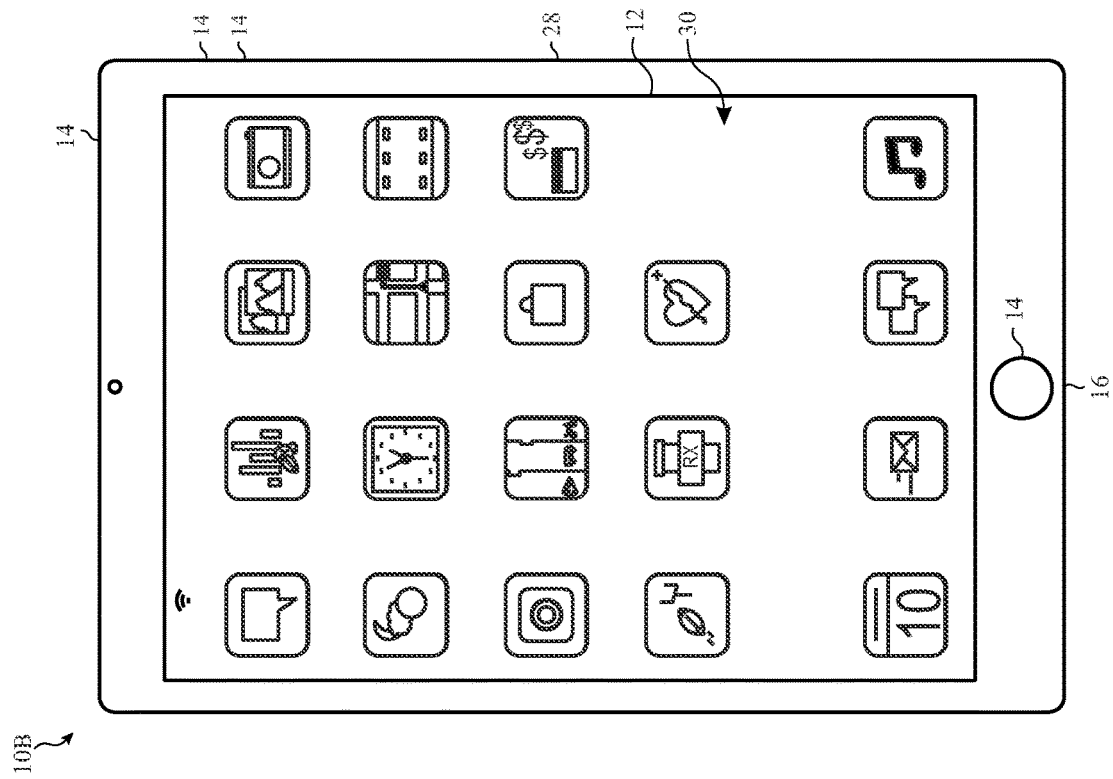
FIG. 3 is a front view of a tablet device representing an example of the electronic device of FIG. 1, in accordance with an embodiment.
Figure 4:
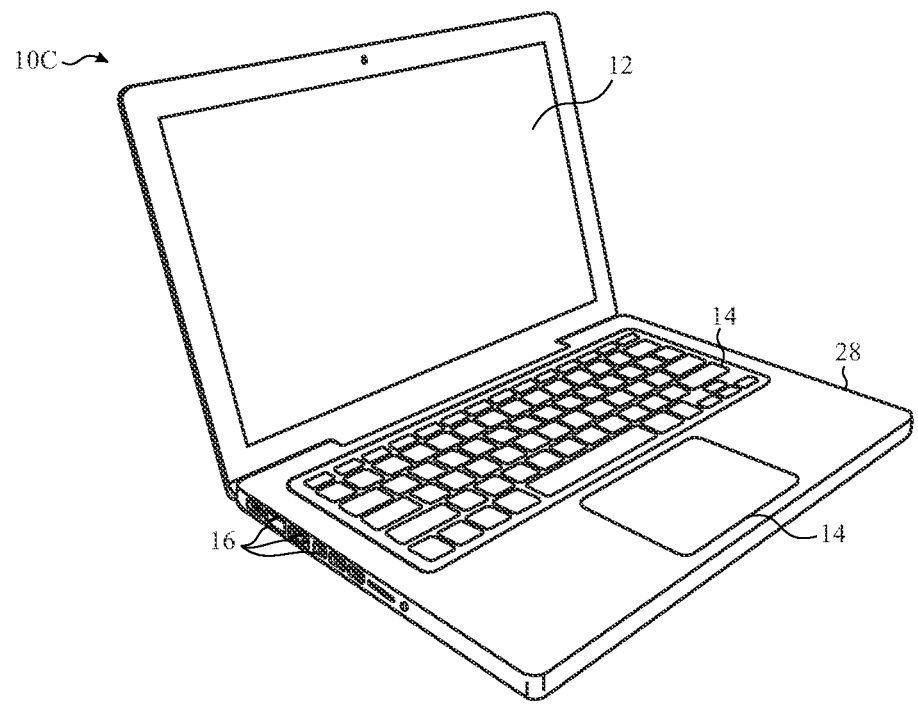
FIG. 4 is a front view of a notebook computer representing an example of the electronic device of FIG. 1, in accordance with an embodiment.
Figure 5:
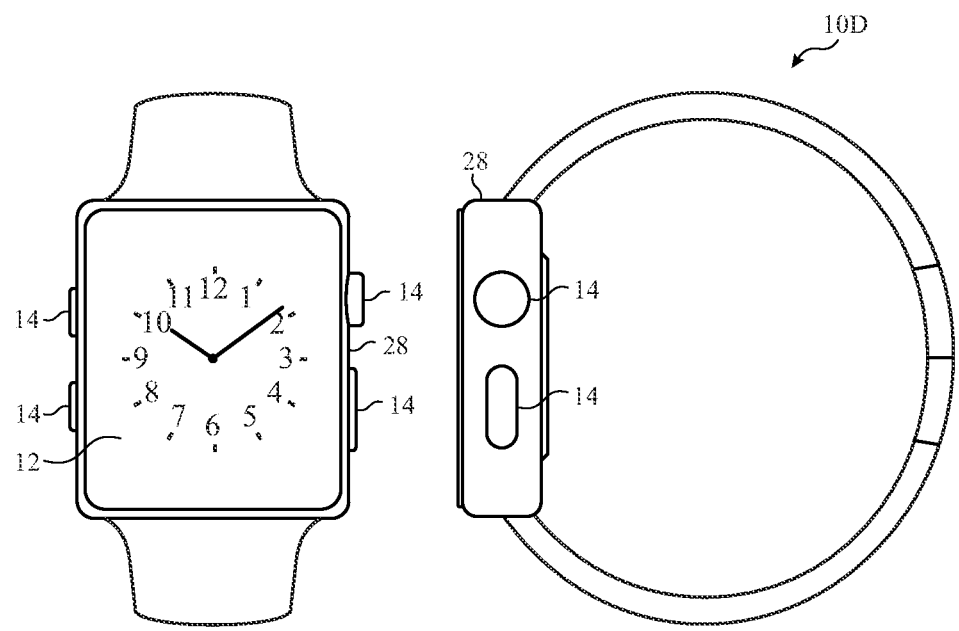
FIG. 5 provides front and side views of a watch representing an example of the electronic device of FIG. 1, in accordance with an embodiment.

The electronic device 10 may take the form of a tablet device 10B, as shown in FIG. 3. By way of example, the tablet device 10B may be any iPad® model available from Apple Inc. A further example of a suitable electronic device 10, specifically a computer 10C, is shown in FIG. 4. By way of example, the computer 10C may be any MacBook® or iMac® model available from Apple Inc. Another example of a suitable electronic device 10, specifically a watch 10D, is shown in FIG. 5. By way of example, the watch 10D may be any Apple Watch® model available from Apple Inc. As depicted, the tablet device 10B, the computer 10C, and the watch 10D all include respective electronic displays 12, input devices 14, I/O ports 16, and enclosures 28.

Figure 6:
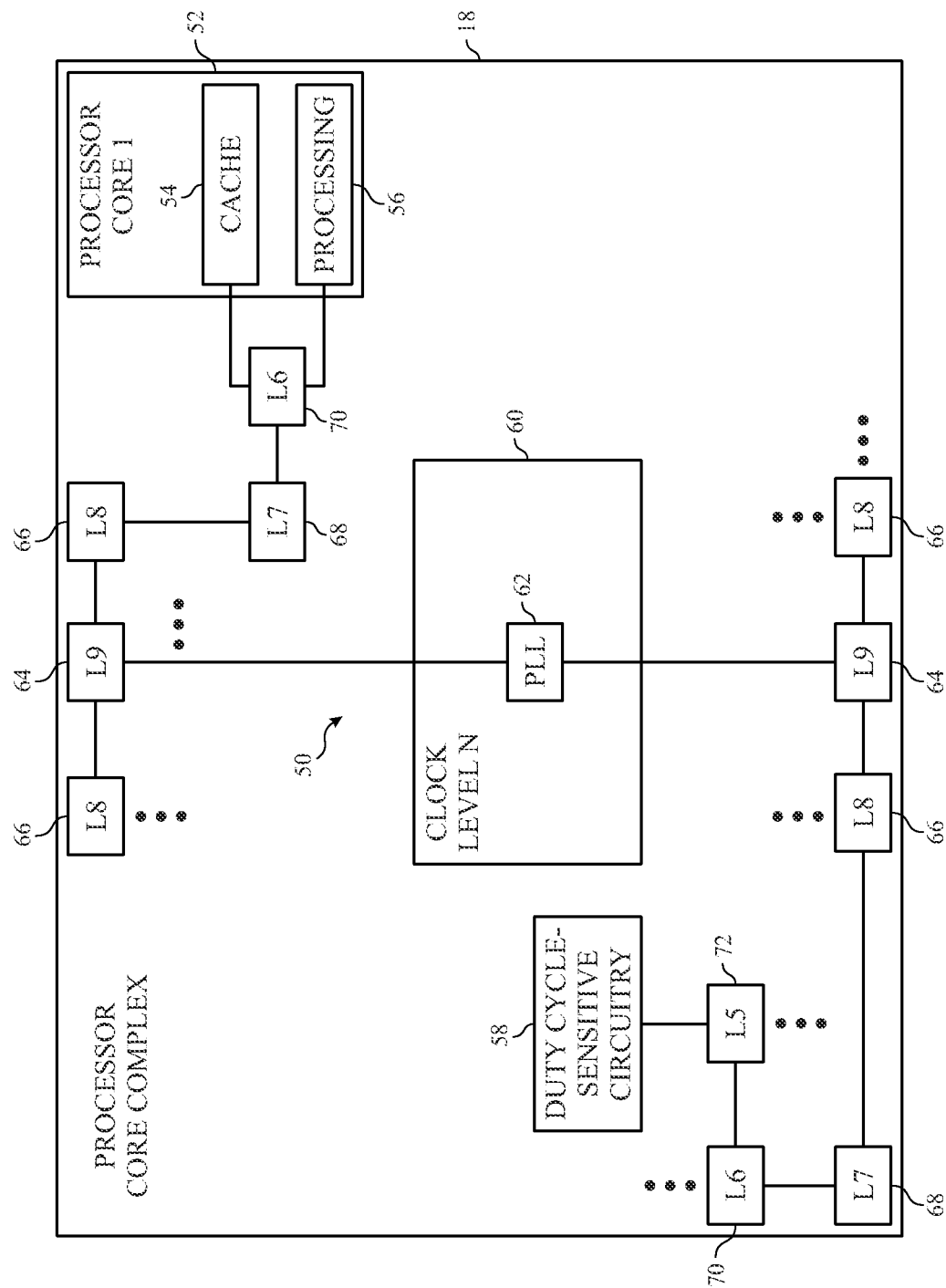
FIG. 6 is a block diagram of a clock tree of an integrated circuit of the electronic device of FIG. 1, in accordance with an embodiment.

Many of the various components of the electronic device 10 may include integrated circuits having clock trees that transmit clock signals. The processor core complex 18, which may represent one or many integrated circuits, will be discussed by way of example. However, it should be understood that the systems and methods of this disclosure may be used in any suitable integrated circuits that use a clock signal provided on a clock tree. As shown in FIG. 6, the processor core complex 18 includes a clock tree 50 that distributes a clock signal that is used by various circuits, such as a processor core 52, which may include cache memory 54 and processing circuitry 56, as well as other duty cycle-sensitive circuitry 58.

As mentioned above, a clock signal is a digital signal that alternates between a high state (e.g., a digital 1) and a low state (e.g., a digital 0) at a particular frequency. Various circuits of the integrated circuit may perform operations and transfer data according to the changes in state of the clock signal. Some circuits may use both low-to-high transitions and high-to-low transitions of the clock signal. These circuits may be particularly sensitive to the duty cycle of the clock signal. The clock signal may have any suitable duty cycle. For example, a clock signal that is equally high and low is said to have a 50% duty cycle. Circuits may be designed to operate using a particular duty cycle. For example, circuits that transfer data twice per clock cycle at a double data rate (DDR) transfer rate may generally operate using a 50% duty cycle. Since these circuits could malfunction if the duty cycle differs too much from 50%, the clock signal duty cycle may be calibrated and corrected.

Indeed, a global clock source 60 may output a global clock signal onto the clock tree 50 that has been calibrated and corrected to achieve a target duty cycle (e.g., a 50% duty cycle). The global clock source 60 may include a phase-locked loop (PLL) 62 that generates an initial clock signal at a particular duty cycle. There may be several levels of the clock tree 50 from the PLL 62 to the output of the global clock source 60. Circuitry such as level shifters and clock gaters may cause some distortion in the clock signal, which could cause the global clock signal to have an undesirable duty cycle even if the initial clock signal from the PLL 62 has the target duty cycle. As will be discussed below, the duty global clock signal output by the global clock source 60 may be measured and duty cycle correction circuitry of the PLL 62 may be calibrated to reduce or eliminate any duty cycle distortion at the output of the global clock source 60.

The clock signal output by the global clock source 60 may pass through various other levels and circuits of the clock tree 50. These may include other level shifters, clock gaters, and the like. Here, the global clock source 60 is represented as starting at clock level N, where N may be any desired highest level of the clock tree 50. As mentioned above, there may be several levels (e.g., 2, 3, 4, 5, 6 levels) of the clock tree 50 between the PLL 62 and the output of the global clock source 60. In the example of FIG. 6, the clock signal is shown exiting the global clock source 60 and traversing a ninth level (L9) 64, an eight level (L8) 66, a seventh level (L7) 68, a sixth level (L6) 70, and a fifth level (L5) 72. This may continue as the clock tree 50 continues to branch into smaller and smaller branches (eventually reaching a multitude of leaf nodes). Here, the clock signal is shown to enter the processor core 52 after reaching L6 70 and to enter certain other duty cycle-sensitive circuitry 58 after reaching L5 72. However, it should be understood that the various clock tree levels are shown by way of example, and that any suitable number of clock tree levels may be used.

Figure 7:
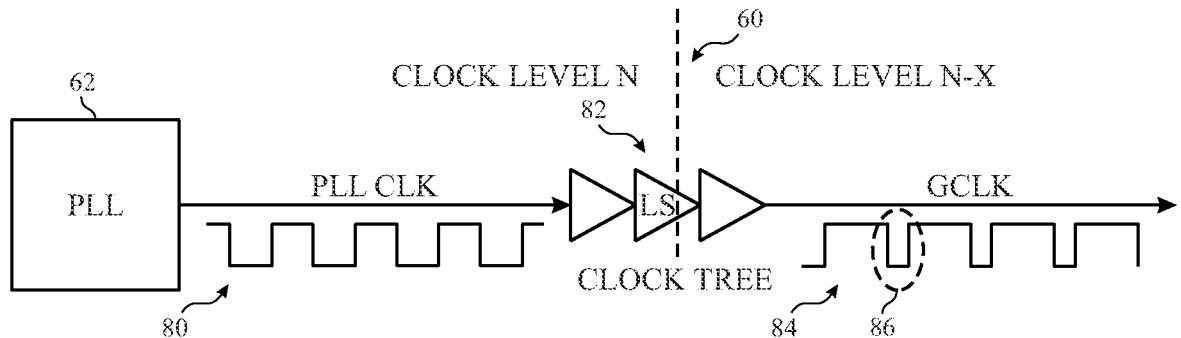
FIG. 7 is a diagram illustrating duty cycle distortion that could occur in a clock signal, in accordance with an embodiment.

Without duty cycle correction, the duty cycle of the clock could vary from a desired value. As shown in FIG. 7, the PLL 62 may produce a PLL clock signal 80 that has a target duty cycle (here, a 50% duty cycle). Yet after passing through various levels 82 of the clock tree 50 to reach the output of the global clock source 60, the resulting global clock signal 84 may experience duty cycle distortion 86 if not otherwise corrected. Although a 50% duty cycle may be desired, an uncorrected global clock signal 84 is shown to have a clock signal duty cycle of greater than 50%. Similar distortion could arise in subsequent levels of the clock tree 50. To ensure that the clock signal has the target duty cycle at the lower levels of the clock tree 50, where the circuits that consume the clock signal receive it, the duty cycle of the clock signal may be calibrated at multiple levels.

Figure 8:
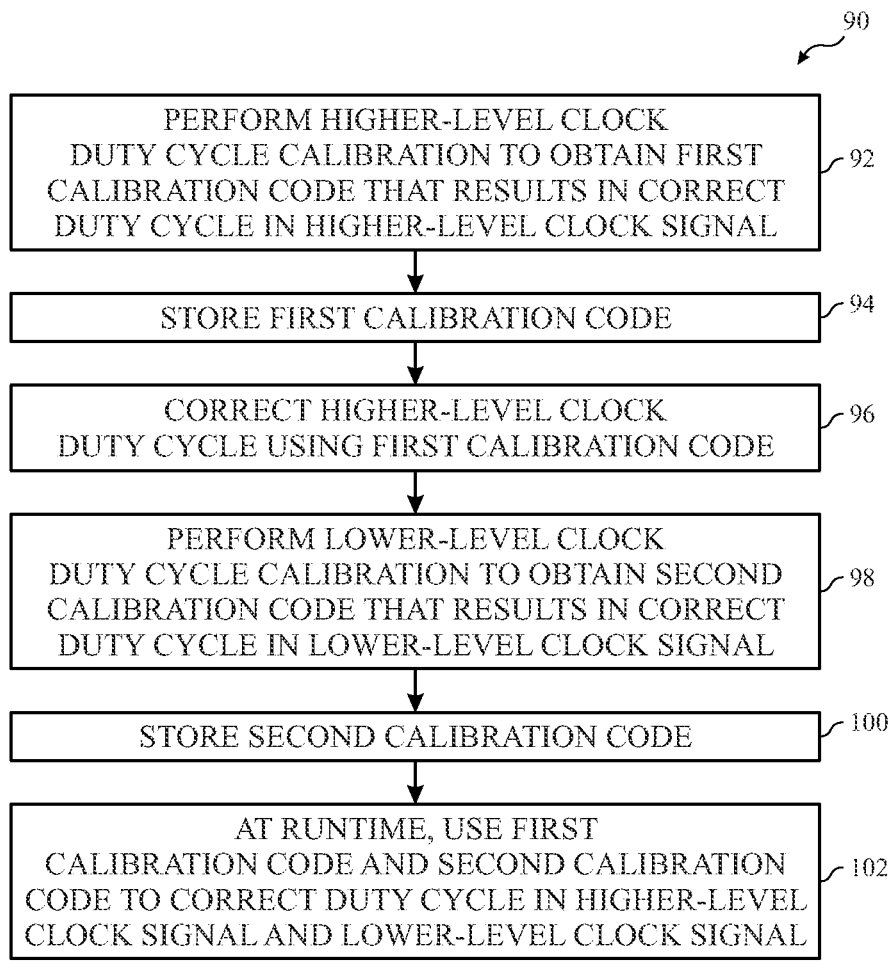
FIG. 8 is a flowchart of a method for calibrating and correcting duty cycle distortion, in accordance with an embodiment.

A flowchart 90 of FIG. 8 represents one method for correcting the clock signal duty cycle at multiple levels. Initially, clock duty cycle correction may be performed at the PLL 62 using the clock signal from the output of the global clock source 60 (e.g., GCLK) as feedback (block 92). A first calibration code may be determined as discussed further below with reference to FIG. 9 and stored (block 94). The calibration code may be used by the PLL to adjust the time the PLL clock signal 80 is has a high state in comparison to a low state, resulting in a proper duty cycle in the global clock signal 84 at the output of the global clock source 60 (block 96).

Thereafter, a similar clock duty cycle correction may be performed on a local clock signal at a lower level of the clock tree as feedback (block 98). A second calibration code may be determined as discussed further below with reference to FIG. 11 and stored (block 100). Thereafter, at runtime, circuitry of the clock tree may use the first and second calibration codes to correct the duty cycle of the global clock signal and the local clock signal (block 102).

Figure 9:
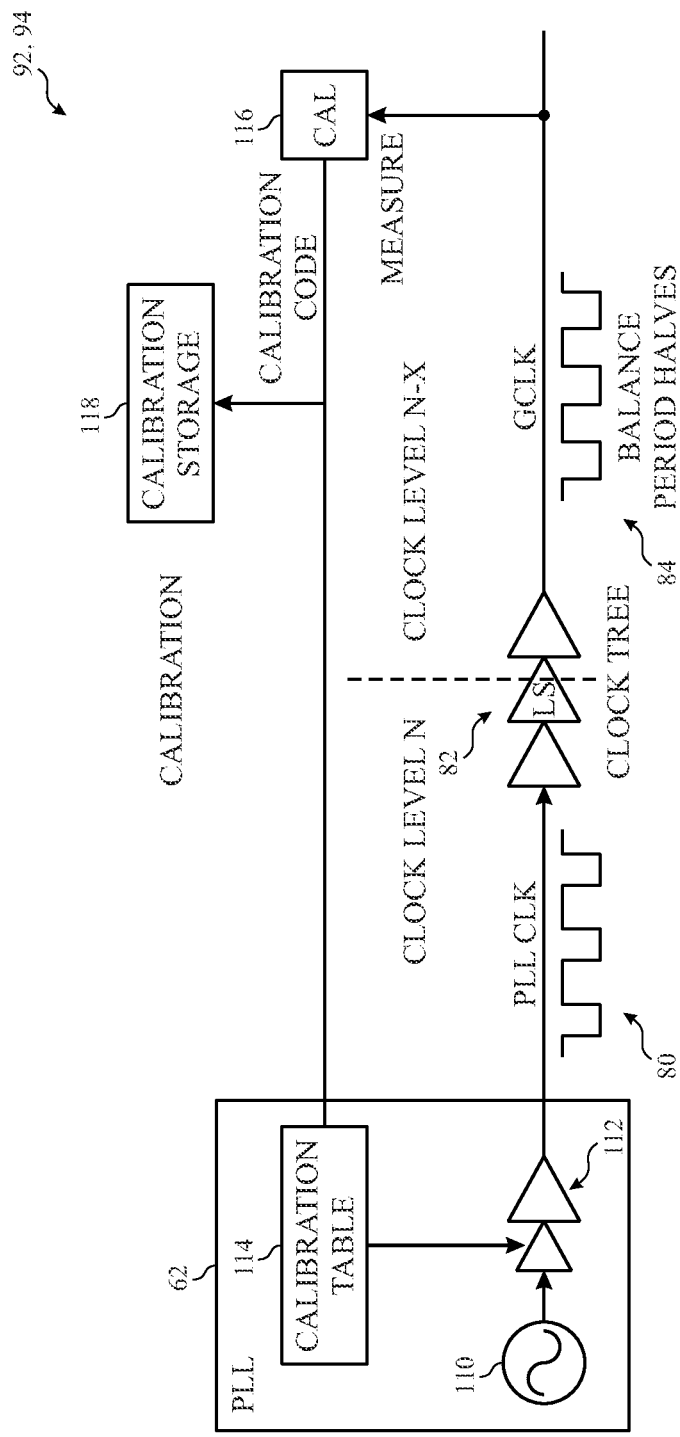
FIG. 9 is a diagram illustrating duty cycle calibration at a global clock level of a clock tree, in accordance with an embodiment.

FIG. 9 represents a global clock signal calibration (e.g., as discussed with reference to blocks 92 and 94 of the flowchart 90 of FIG. 8). The PLL 62 may have any suitable architecture in which an oscillator 110 (e.g., a voltage controlled oscillator) outputs a clock signal based on some reference frequency. A duty cycle correction circuit 112 may introduce a programmable amount of skew into the clock signal by engaging a programmable number of PMOS and a programmable number of NMOS devices in a CMOS circuit. In so doing, the duty cycle correction circuit may lengthen or shorten the amount of time that the clock signal is in a high state each clock cycle. The programmable number of PMOS and a programmable number of NMOS devices may be set by a calibration code stored in a calibration table 114.

During calibration, the PLL 62 may output a PLL clock signal (PLL CLK) 80 that passes through various levels 82 of the clock tree (e.g., from a clock level N through X levels 82 to a clock level N-X) before being output as the global clock signal (GCLK) 84. A calibration circuit 116 may measure the global clock signal (GCLK) 84 as feedback to determine a current duty cycle of the global clock signal (GCLK) 84. For example, the calibration circuit 116 may be a finite state machine circuit that samples the global clock signal (GCLK) 84 any suitable number of times to determine a ratio of samples in a high-state to samples in a low-state. If the target duty cycle is 50%, the ratio of different-state samples should be 1:1. The calibration circuit 116 may generate adjust a calibration code up or down to cause the duty cycle correction circuit 112 of the PLL 62 to introduce programmable skew to adjust the duty cycle of the PLL clock 80, which traverses the various levels 82 of the clock tree to reach the calibration circuit 116 as the global clock signal 84.

The calibration circuit 116 may use any suitable method to settle on a calibration code that results in the target duty cycle or a duty cycle closest to the target duty cycle. For example, the calibration circuit 116 may perform a binary search through the possible calibration codes until the best calibration code is identified. Eventually, the calibration circuit 116 settles on a calibration code that results in the global clock signal 84 achieving the target duty cycle. In one example, the calibration circuit 116 may maintain a count of high-state samples to low-state samples (e.g., add to counter for high-state, subtract from counter for low-state) that may be considered to have measured a duty cycle of 50% when the count is at or within a threshold from a count of 0 after some sufficiently high number of samples. The same techniques may be used to adjust duty cycles other than 50% (e.g., for circuits that may benefit from imbalanced pulse-width) by counting the imbalance of samples in high state and low state. For example, a desired imbalanced duty cycle may be reached when the count is at or within a threshold from a count of X after some Y number of samples. The calibration circuit 116 may use any suitable sampling frequency that may sample a sufficient number of possible positions of the clock cycle of the global clock signal so as to accurately capture the duty cycle.

When the calibration circuit 116 identifies a calibration code that results in the global clock signal 84 having a desired clock duty cycle (e.g., the calibration circuit 116 consistently measures a substantially equal number of high states and low states, meaning the global clock signal 84 has a 50% duty cycle), that calibration code may be stored in calibration storage 118. The calibration storage 118 may be any suitable storage of the electronic device, and may be part of the memory 20 and/or the storage device 22. In one example, the calibration storage 118 includes eFuses that are blown or set with the calibration code identified by the calibration circuit 116.

Figure 10:
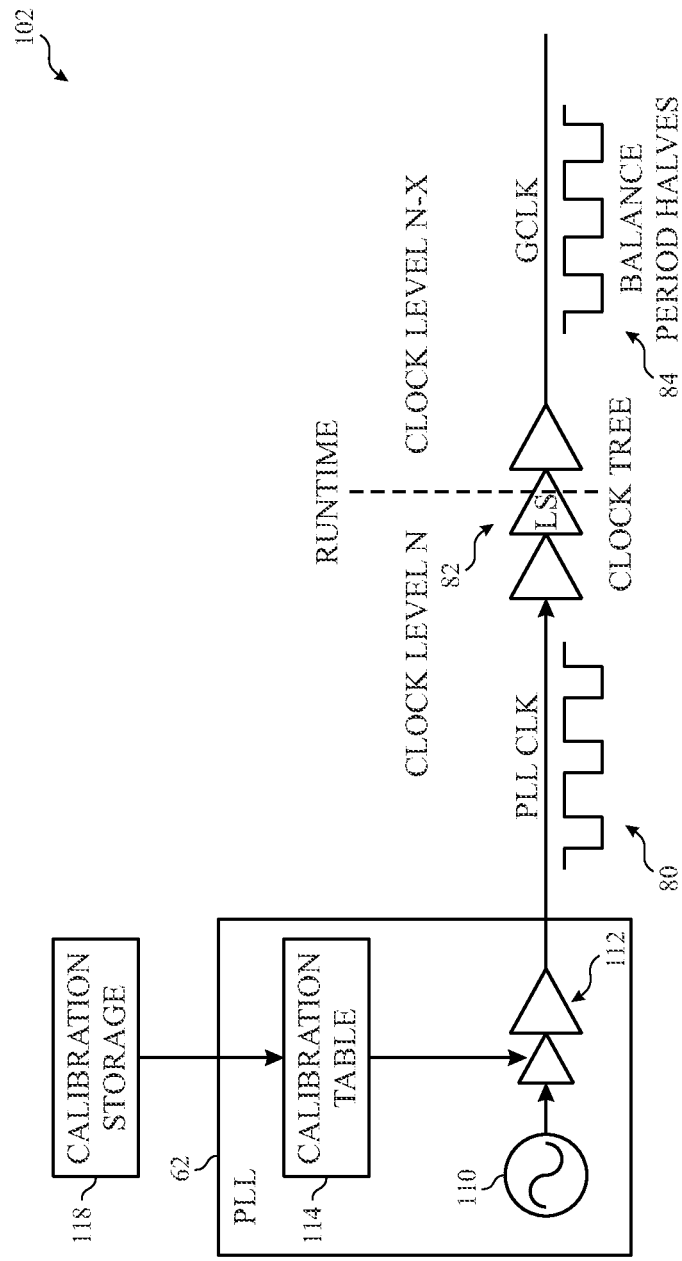
FIG. 10 is a diagram illustrating duty cycle correction at the global clock level of the clock tree at runtime based on the calibration of FIG. 9, in accordance with an embodiment.

At runtime, as shown in FIG. 10, the calibration code stored in the calibration storage 118 may be written to the calibration table 114 and used by the duty cycle correction circuit 112 of the PLL 62. For example, the calibration table 114 may be part of a DVFM table that is configured by software. As a result, the global clock signal 84 may have the target duty cycle as calibrated.

Figure 11:
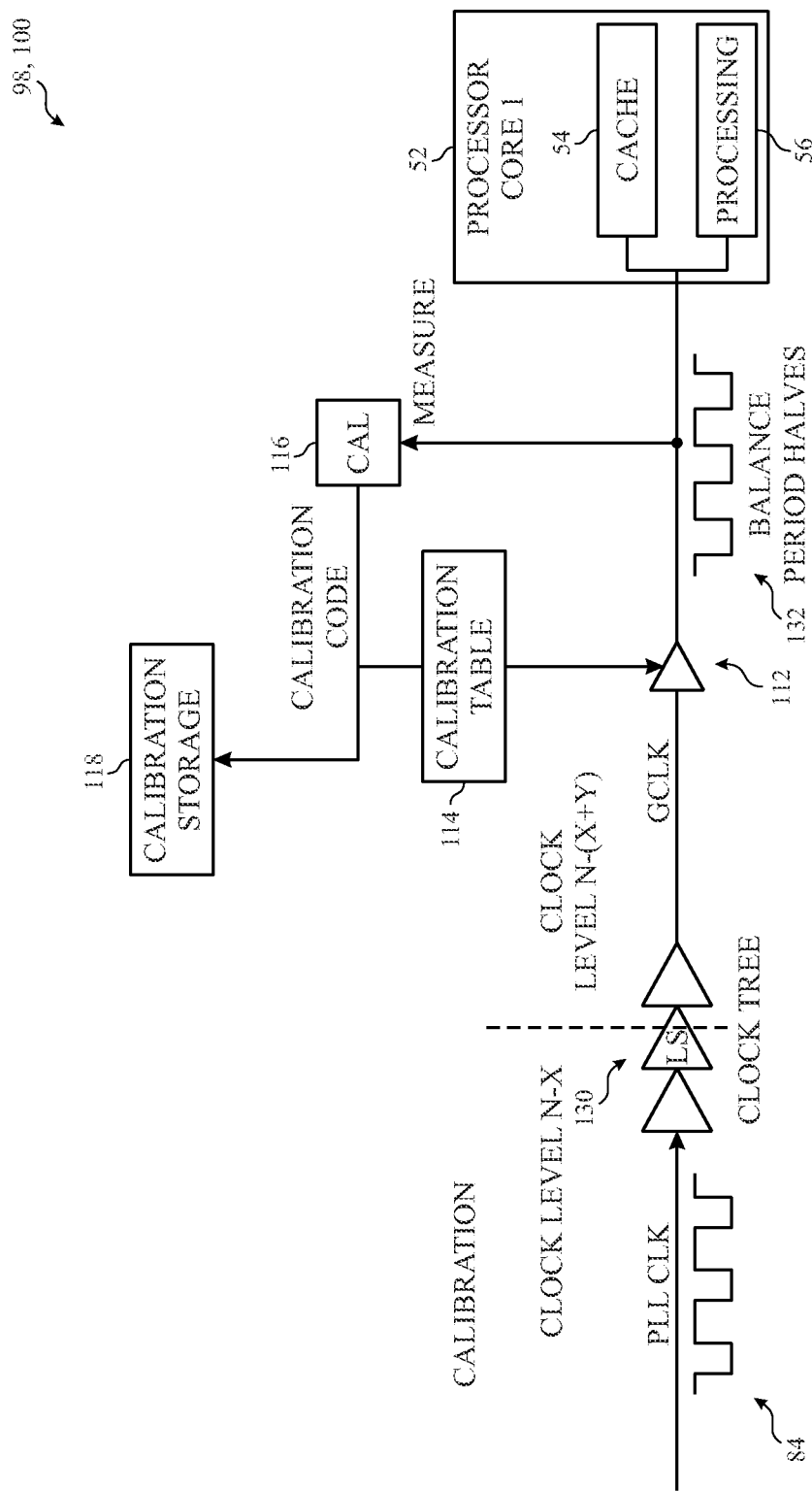
FIG. 11 is a diagram illustrating duty cycle calibration at a lower level of a clock tree, in accordance with an embodiment.

FIG. 11 represents a local clock signal calibration (e.g., as discussed with reference to blocks 98 and 100 of the flowchart 90 of FIG. 8). Indeed, certain clock endpoints, such as the cache 54 or processing circuitry 56 of the processor core 52, may be particularly sensitive to clock duty cycle. As such, the local clock signal calibration shown in FIG. 11 may correct additional clock signal distortion that could be introduced as the global clock signal 84 traverses further levels 130 of the clock tree as a local clock signal 132. In this example, the global clock signal 84 passes from a clock level N-X through Y clock tree levels 82 to reach a clock level N-(X+Y). Along the way, the clock signal may experience unequal skew in high state and low state portions of the clock signal, which could result in duty cycle distortion if not corrected.

The duty cycle correction circuit 112, calibration table 114, and calibration circuit 116 may operate as described above with reference to FIG. 9. That is, the duty cycle correction circuit 112 may introduce a programmable amount of skew into the clock signal by engaging a programmable number of PMOS and a programmable number of NMOS devices in a CMOS circuit. This may lengthen or shorten the amount of time that the clock signal is in a high state each clock cycle. The programmable number of PMOS and a programmable number of NMOS devices may be set by a calibration code stored in the calibration table 114.

The calibration circuit 116 in FIG. 11, having the same or a similar architecture as the calibration circuit 116 of FIG. 9, may measure the local clock signal 132 as feedback to determine a current duty cycle of the local clock signal 132. The calibration circuit 116 may generate a calibration code that is used by the duty cycle correction circuit 112 to adjust the local clock signal 132. In some embodiments, a single calibration circuit 116 may be used to perform the calibration of the global clock signal (e.g., as in FIG. 9) as well as the local clock signal 132 (e.g., as in FIG. 11). Note that, for some circuit designs, the target duty cycle for the local clock signal 132 may be different from that of the global clock signal 84. Indeed, some local nodes may have different design constraints with respect to clock duty cycle and likewise may seek different clock duty cycle corrections.

When the calibration circuit 116 identifies a calibration code that results in the local clock signal 132 having a desired clock duty cycle (e.g., for a 50% duty cycle, the calibration circuit 116 consistently measures a substantially equal number of high states and low states, meaning the local clock signal 132 has a 50% duty cycle), that calibration code may be stored in calibration storage 118. As noted above, the calibration storage 118 may be any suitable storage of the electronic device, and may be part of the memory 20 and/or the storage device 22. In one example, the calibration storage 118 includes eFuses that are blown or set with the calibration code identified by the calibration circuit 116.

Figure 12:
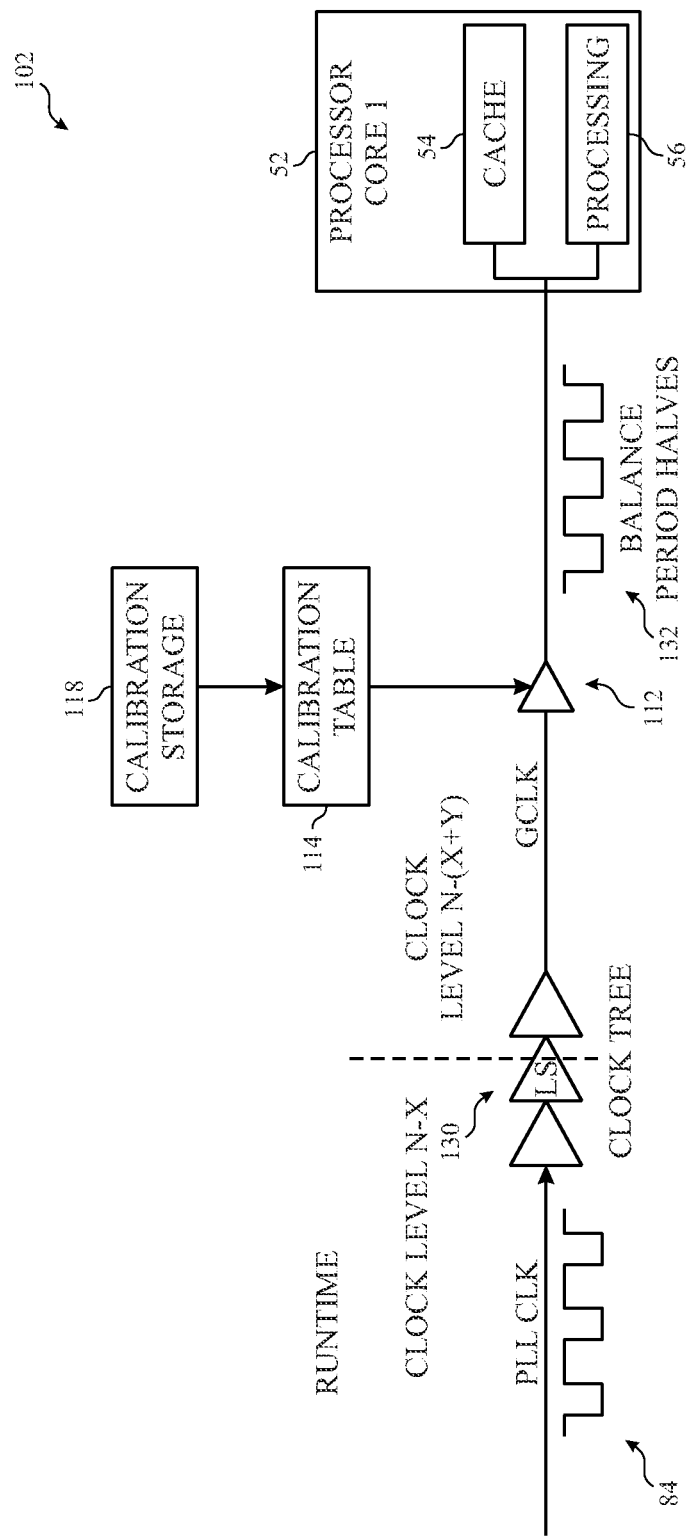
FIG. 12 is a diagram illustrating duty cycle correction at the lower level of the clock tree at runtime based on the calibration of FIG. 11, in accordance with an embodiment.

At runtime, as shown in FIG. 12, the calibration code stored in the calibration storage 118 may be written to the calibration table 114 and used by the duty cycle correction circuit 112 of the PLL 62. For example, the calibration table 114 may be part of a DVFM table that is configured by software. As a result, the local clock signal 132 may also operate at the target duty cycle as calibrated.

Figure 13:
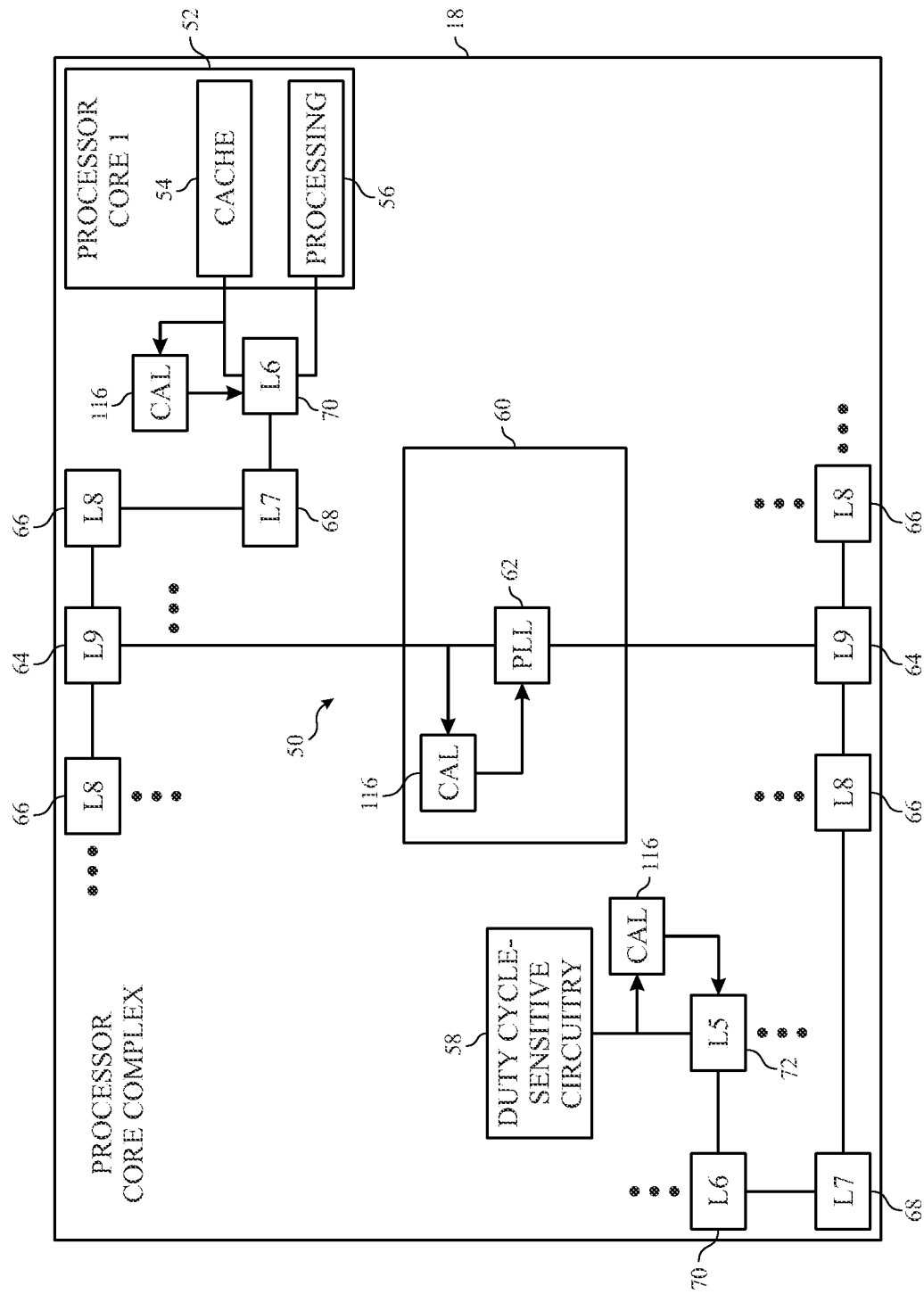
FIG. 13 is a block diagram of the clock tree of FIG. 7 during a duty cycle calibration, in accordance with an embodiment.

FIG. 13 illustrates one manner in which the calibration may take place in the clock tree 50. Here, there are calibration circuits 116 in the global clock source 60, at a local clock node at the endpoint to the processor core 52 (e.g., the cache 54 and processing circuitry 56), and at an endpoint near other duty cycle-sensitive circuitry 58. In one example, the other duty cycle-sensitive circuitry 58 may have performance constraints that use a different target duty cycle than the processor core 52. Indeed, the target duty cycle may be an imbalanced (e.g., pulsed) duty cycle (e.g., as may be used in an analog-to-digital (ADC) circuit). Thus, in some embodiments, the calibration circuit 116 used for the local clock input to the processor core 52 may calibrate for a target duty cycle of 50%, while the calibration circuit 116 used for the local clock input to the duty cycle-sensitive circuitry 58 may calibrate for a target duty cycle that is imbalanced (e.g., greater than 50%, less than 50%, a pulse).

Figure 14:
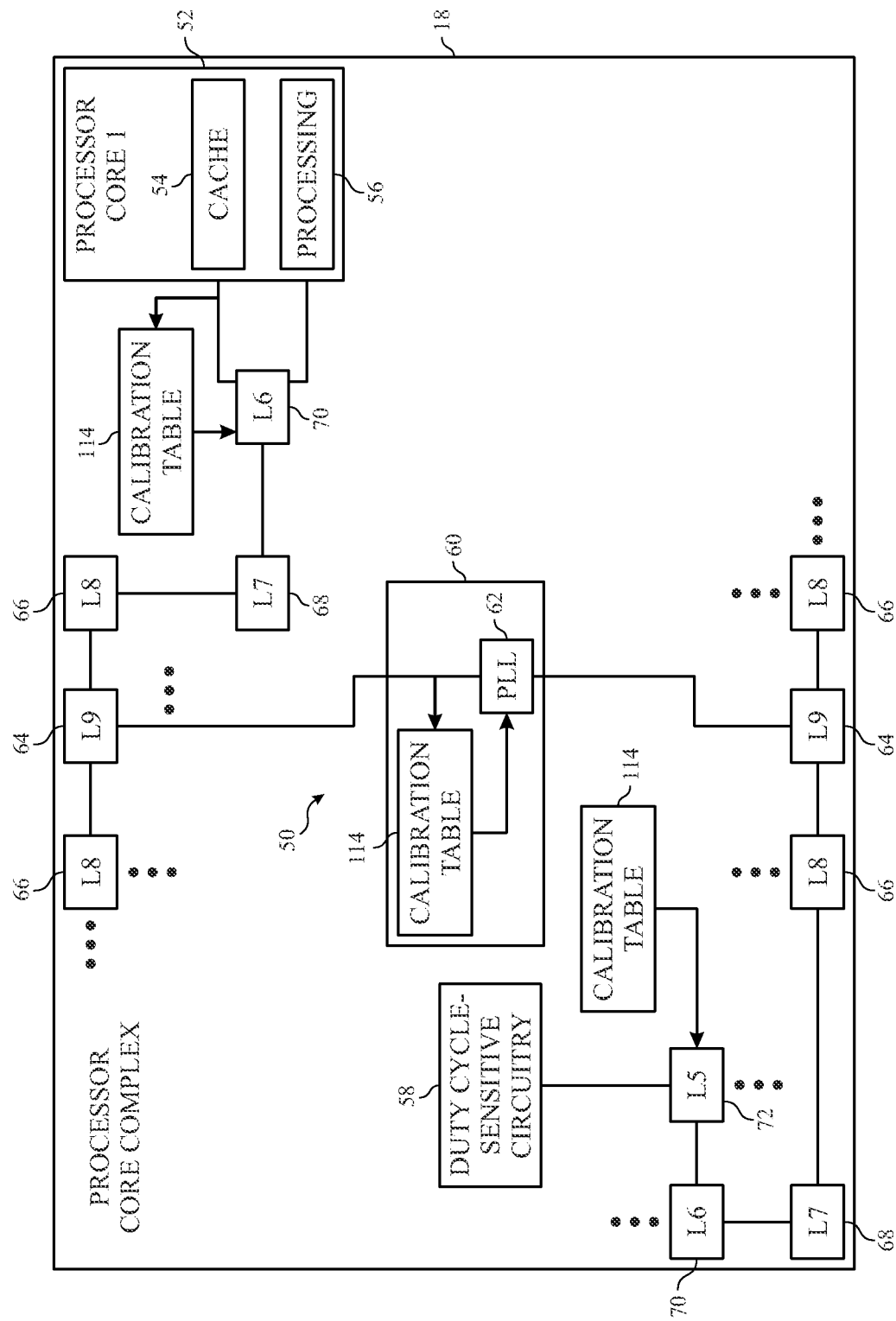
FIG. 14 is a block diagram of the clock tree of FIG. 7 at runtime performing a duty cycle correction based on the calibration of FIG. 13, in accordance with an embodiment.

FIG. 14 illustrates the clock tree at runtime. The calibration codes may be written to calibration tables 114 associated with the global clock source 60 and certain local nodes (e.g., at the processor core 52 and duty cycle-sensitive circuitry 58). For example, the calibration table 114 may be part of a DVFM table that is configured by software. As a result, the global clock signal 84 and the calibrated local nodes may operate at their respective target duty cycles.

Figure 15:
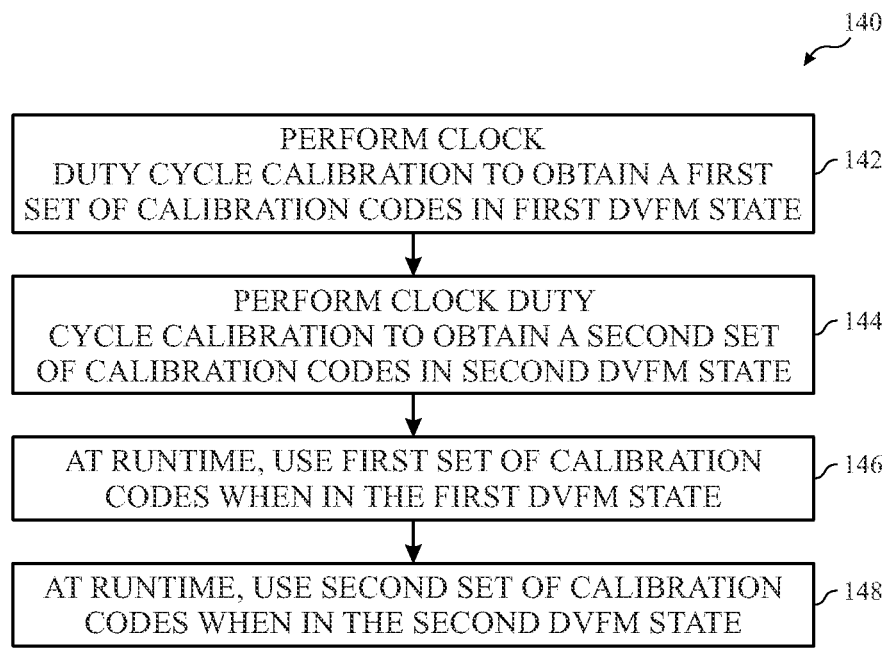
FIG. 15 a flowchart of a method for calibrating and correcting duty cycle distortion at different dynamic voltage and frequency management (DVFM) states, in accordance with an embodiment.

At runtime, different DVFM states may result in different amounts of skew affecting the clock signals as they traverse the clock tree. As such, the calibration may be performed in more than one DVFM states. For example, as shown by a flowchart 140 of FIG. 15, the clock duty cycle may be calibrated while clock is operating in a first DVFM state (e.g., a higher-frequency, higher-power state) and the resulting calibration codes may be stored (block 142). The clock duty cycle may also be calibrated while clock is operating in a second DVFM state (e.g., a lower-frequency, lower-power state) and the resulting calibration codes may also be stored (block 144). For blocks 142 and 144, the global clock signal may be calibrated, one or more local clock signals may be calibrated, or the global clock signal and the local clock signals may be calibrated. Thereafter, at runtime, when the electronic device is operated in the first DVFM state (e.g., the higher-frequency, higher-power state), the duty cycle of the clock signal(s) may be corrected using the first calibration codes (block 146). When the electronic device is operated in the second DVFM state (e.g., the lower-frequency, lower-power state), the duty cycle of the clock signal(s) may be corrected using the first calibration codes (block 148).

Calibration may be performed for all possible DVFM states supported by the electronic device of a subset of the DVFM states. Calibration codes associated with each DVFM state may then be used at runtime. Additionally or alternatively, calibration may be performed just for a subset all possible DVFM states supported by the electronic device. Calibration codes associated with a calibrated DVFM state that is closest to the present DVFM state at runtime may then be used. Considering the example of FIG. 15, when the DVFM state at runtime is relatively higher-frequency and higher-power among the possible DVFM states, the first set of calibration codes may be used. When the DVFM state at runtime is relatively lower-frequency and lower-power among the possible DVFM states, the second set of calibration codes may be used.

Figure 16:
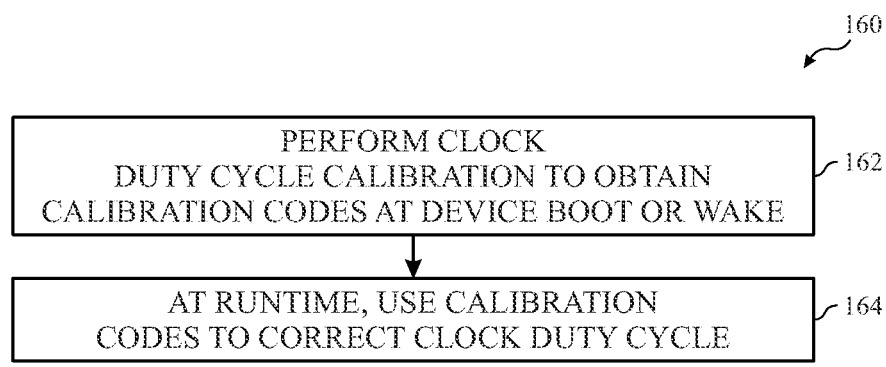
FIG. 16 is a flowchart of a method for calibrating and correcting duty cycle distortion at device boot or wake, in accordance with an embodiment.

The calibration may take place once or at several different times. For example, calibration may be performed at manufacture, on device boot or wake, periodically (e.g., while charging at night, weekly, monthly, or annually), or upon switching dynamic voltage and frequency management (DVFM) states. For instance, as shown in a flowchart 160 of FIG. 16, clock duty cycle calibration may be used to obtain calibration codes that achieve a target clock signal duty cycle when the electronic device boots up or awakes (block 162). This may allow the duty cycle to be calibrated for any changes in condition when the electronic device restarts (e.g., temperature changes, age). For example, the clock duty cycle calibration may be part of a power-on self-test on boot. For block 162, the global clock signal may be calibrated, one or more local clock signals may be calibrated, or the global clock signal and the local clock signals may be calibrated. At runtime, the calibration codes determined in the clock duty cycle calibration of block 162 may be used to correct the duty cycle to achieve the desired target duty cycle (block 164).

Figure 17:
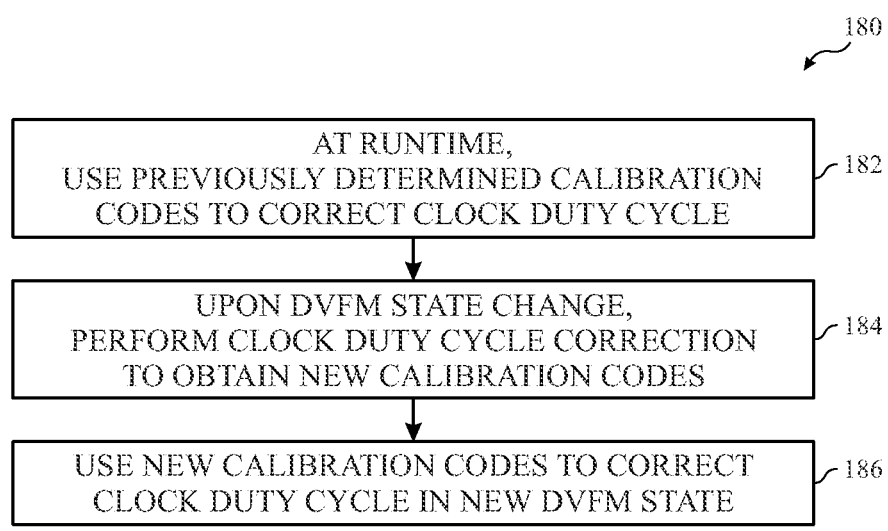
FIG. 17 is a flowchart of a method for calibrating and correcting duty cycle distortion upon a transition to a new dynamic voltage and frequency management (DVFM) state, in accordance with an embodiment.

In some cases, as shown in a flowchart 180 of FIG. 17, the duty cycle calibration may take place dynamically at runtime. The clock tree may provide clock signals with corrected clock duty cycle based on calibration codes determined in a previous calibration (block 182). When a DVFM state changes, calibration may again take place in the new DVFM state (block 184). This may result in new calibration codes that can be stored and used to correct the clock duty cycle while operating in the new DVFM state (block 186).

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure. For example, the duty cycle correction of this disclosure may be performed at multiple nodes of a clock tree, including intermediate nodes between the global clock signal and an endpoint that enters a circuit that is sensitive to duty cycle. For example, the duty cycle calibration and correction may be performed for three, four, five, or more clock tree levels. In another example, the duty cycle calibration and correction may be performed for every clock tree level.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. An integrated circuit comprising:
a clock tree configured to provide a clock signal;
a circuit that is sensitive to clock duty cycle that receives the clock signal at a lower level of the clock tree;
a first duty cycle correction circuit configured to apply a programmable amount of skew to the clock signal to adjust a clock duty cycle of the clock signal to a first target duty cycle at a higher level of the clock tree; and
a second duty cycle correction circuit configured to adjust the clock duty cycle of the clock signal to a second target duty cycle at the lower level of the clock tree.

2. The integrated circuit of claim 1, wherein the circuit that is sensitive to clock duty cycle comprises a circuit that operates using double data rate (DDR) data transfer.

3. The integrated circuit of claim 1, wherein the circuit that is sensitive to clock duty cycle comprises a memory device.

4. The integrated circuit of claim 1, wherein the circuit that is sensitive to clock duty cycle comprises an analog to digital converter (ADC).

5. The integrated circuit of claim 1, wherein the first target duty cycle and the second target duty cycle are the same.

6. The integrated circuit of claim 1, wherein the first target duty cycle and the second target duty cycle are 50%.

7. The integrated circuit of claim 1, wherein the first duty cycle correction circuit is configured to apply the programmable amount of skew to the clock signal at the higher level of the clock tree based on a first calibration code obtained from a first calibration circuit before runtime.

8. The integrated circuit of claim 7, wherein the first calibration code is stored in a nonvolatile memory before runtime.

9. The integrated circuit of claim 7, wherein the first calibration code is configured to be written into a dynamic voltage and frequency management (DVFM) table accessible to the first duty cycle correction circuit.

10. The integrated circuit of claim 7, wherein the second duty cycle correction circuit is configured to apply a second programmable amount of skew to the clock signal at the lower level of the clock tree based on a second calibration code obtained from a second calibration circuit before runtime.

11. The integrated circuit of claim 10, wherein the first calibration code and the second calibration code are different.

12. A method comprising:
performing a global clock duty cycle calibration to correct a global duty cycle error in a global clock signal of a clock tree of an integrated circuit;
storing a first calibration code that causes a first duty cycle correction circuit to correct the global duty cycle error;
correcting the global duty cycle error of the global clock signal using the first calibration code in the first duty cycle correction circuit;
providing the global clock signal to a lower level of the clock tree to produce a lower level clock signal;
performing a local clock duty cycle calibration to correct a local duty cycle error in the lower level clock signal; and
storing a second calibration code that causes a second duty cycle correction circuit to correct the local duty cycle error.

13. The method of claim 12, wherein the method is performed before productization of the integrated circuit.

14. The method of claim 12, wherein the method is performed upon a boot of the integrated circuit.

15. The method of claim 12, wherein the method is performed upon a change of dynamic voltage and frequency management (DVFM) state.

16. The method of claim 12, wherein storing the first calibration code and storing the second calibration code comprise blowing eFuses on the integrated circuit.

17. The method of claim 12, wherein the method is performed at least once while the integrated circuit operates in a first dynamic voltage and frequency management (DVFM) state and at least once while the integrated circuit operates in a second dynamic voltage and frequency management (DVFM) state.

18. A method comprising:
performing a first clock duty cycle calibration on an integrated circuit while the integrated circuit operates at a first dynamic voltage and frequency management (DVFM) state to obtain a first set of calibration codes that, when programmed into a duty cycle correction circuit of the integrated circuit, cause a clock signal of the integrated circuit to have a target duty cycle; and
performing a second clock duty cycle calibration on the integrated circuit while the integrated circuit operates at a second dynamic voltage and frequency management (DVFM) state to obtain a second set of calibration codes that, when programmed into the duty cycle correction circuit of the integrated circuit, cause the clock signal of the integrated circuit to have the target duty cycle.

19. The method of claim 18, comprising storing the first set of calibration codes and the second set of calibration codes on the integrated circuit.

20. The method of claim 18, wherein the first set of calibration codes is different from the second set of calibration codes.

\* \* \* \* \*